United States Patent [19]

Tachiuchi et al.

[11] Patent Number: 4,628,482
[45] Date of Patent: Dec. 9, 1986

[54] COMMON MEMORY CONTROL SYSTEM WITH TWO BUS MASTERS

[75] Inventors: Tsuguji Tachiuchi, Odawara; Toyota Honda, Yokohama, both of Japan

[73] Assignee: Hitachi, Ltd., Tokyo, Japan

[21] Appl. No.: 491,227

[22] Filed: May 3, 1983

[30] Foreign Application Priority Data

May 7, 1982 [JP] Japan .................................. 57-75208

[51] Int. Cl.⁴ .......................................... G06F 13/16
[52] U.S. Cl. .................................... 364/900; 365/222
[58] Field of Search ................ 364/200, 900; 365/222

[56] References Cited

U.S. PATENT DOCUMENTS

| | | | |
|---|---|---|---|
| 3,765,003 | 10/1973 | Paivinen et al. | 340/173 CA |
| 3,858,184 | 12/1974 | DeVries | 340/173 DR |
| 4,158,883 | 6/1979 | Kadono et al. | 364/200 |
| 4,218,753 | 8/1980 | Hendrie | 364/900 |
| 4,292,676 | 9/1981 | Henig | 365/222 |
| 4,328,566 | 5/1982 | Thaler | 365/222 |
| 4,332,008 | 5/1982 | Shima et al. | 364/200 |
| 4,333,167 | 6/1982 | McElroy | 365/222 |
| 4,344,157 | 8/1982 | White, Jr. et al. | 365/222 |
| 4,347,589 | 8/1982 | Proebsting | 365/222 |
| 4,376,988 | 3/1983 | Ludwig et al. | 365/222 |
| 4,412,314 | 10/1983 | Proebsting | 365/222 |
| 4,549,284 | 10/1985 | Ikuzaki | 365/222 |

OTHER PUBLICATIONS

Bruce McCormick and Craig Peterson, "Take the 'Dynamics' Out of Dynamic RAM with an IC Controller Handling Refresh", *Electronic Design* 26, vol. 26, Dec. 20, 1978, pp. 72–76.

Short, Kenneth, Microprocessors and Programmed Logic, Prentice Hall, 1981, p. 470.

Buettner, Crooks, Johnson, Saunders, "Transparent Refresh of Dynamic Memories", *IBM Tech. Disc. Bulletin*, vol. 23, No. 4, 9/80, pp. 1592–1602.

*Primary Examiner*—Gareth D. Shaw
*Assistant Examiner*—Martin Yuen
*Attorney, Agent, or Firm*—Antonelli, Terry & Wands

[57] ABSTRACT

In accordance with the present invention, there is provided a data processing apparatus comprising an MPU which inputs or outputs an address signal and a data signal on the time sharing basis, a latching means for latching said address signal, a memory which must be refreshed, and changeover means for connecting said memory to said MPU during a data signal period and connecting said memory to a refresh counter during remaining periods.

11 Claims, 3 Drawing Figures

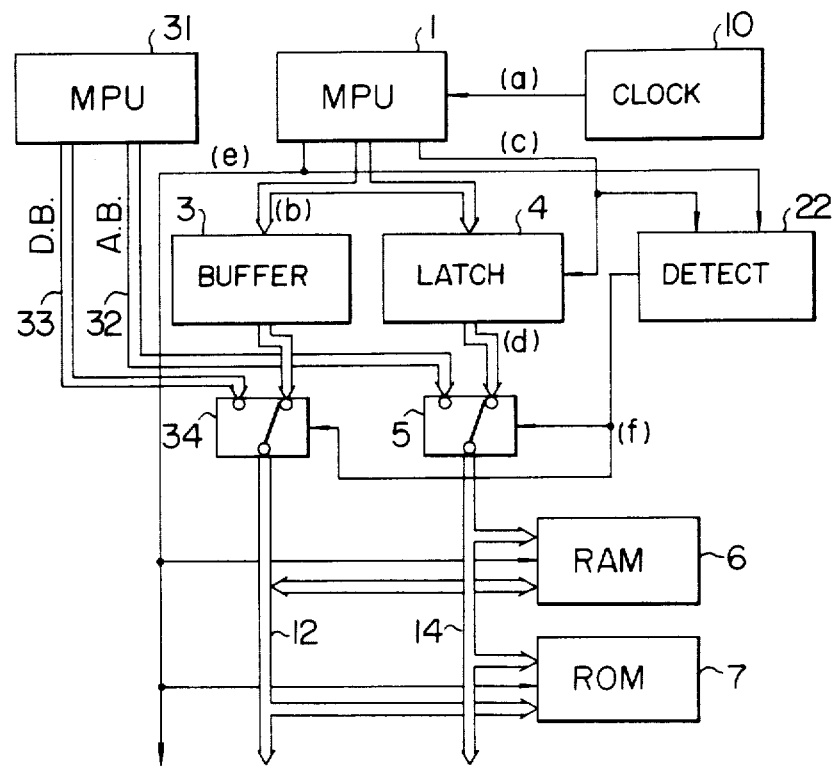

COMMON MEMORY CONTROL SYSTEM WITH TWO BUS MASTERS

The present invention relates to a data processing apparatus wherein a system bus is shared by two or more circuits.

Master data processing units (hereinafter referred to as MPU's) may be roughly classified into 68-type MPU's represented by the model 6800 fabricated by the Motorola, Inc. and 80-type MPU's represented by models 8080 and 8086 fabricated by the Intel corporation. In a 68-type MPU, operation allocated to one MPU cycle is carried out during one MPU clock period and data transmission or transfer between the MPU and the memory or the like is carried out during the latter half of the clock period. Since it is thus predetermined that one MPU cycle corresponds to one MPU clock and the latter half of the clock period is allocated to data transfer (delivery and receipt), the so-called cycle steal refresh approach is used in a data processing apparatus using a 68-type MPU. In this cycle steal refresh approach, refreshing is carried out during the former half of a MPU clock period.

In case of an 80-type MPU, a plurality of MPU clock periods constitute one MPU cycle and various numbers of clock periods are required depending upon the contents of specific MPU operation. In the 80-type MPU, therefore, it is impossible to carry out the cycle steal refreshing such as refreshing in the former half of a clock period which is used in a 68-type MPU. In an approach for a data processing apparatus using an 80-type MPU as described in Japanese Patent Application Laid-Open No. 4532/79 "Automatic Refreshing Apparatus of Idle Time Searching Type", for example, a latch circuit for temporarily storing the data which was been read out of a memory is provided in order to shorten the time required for the MPU to read out data from the memory and refreshing is carried out during the idle time thus obtained in the MPU cycle. In this approach, however, it is impossible to obtain the above described idle time when an instruction provided with a small number of MPU cycles is to be executed, resulting in the problem that refreshing cannot be normally carried out.

Therefore, an object of the present invention is to provide a data processing apparatus wherein the problem of the prior art is solved and the system bus may be shared by other circuits without stopping the MPU.

Thus, in accordance with the present invention, a detection means is provided for detecting the period during which the MPU must be connected to an external unit such as a memory for delivery and receipt of data, and during the period thus detected the system bus which has been connected to the external unit is connected to the MPU whereas the system bus is connected to a bus master such as a refresh counter other than that MPU during the remaining periods excepting the above described period.

FIG. 2 shows signal waveforms in major components of the apparatus illustrated in FIG. 1.

FIG. 3 is a block diagram of another embodiment of the data processing apparatus according to the present invention.

Figure 1:
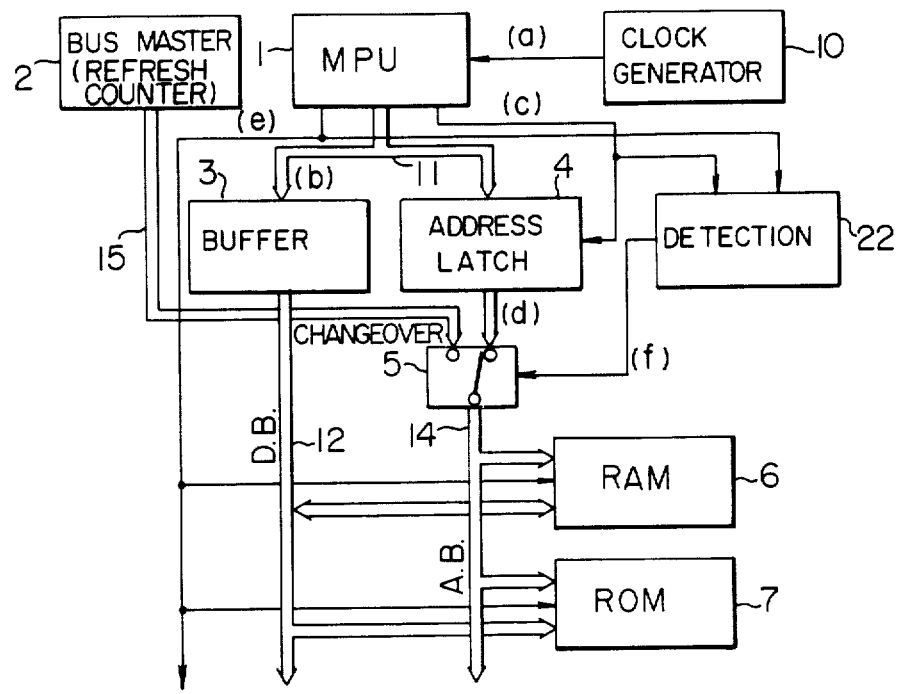

In FIG. 1 which is a block diagram illustrating an embodiment of the present invention, numeral 1 denotes an MPU which is a microprocessing means, preferably a 16-bit microcomputer 8086 fabricated by the Intel Corporation. Numeral 2 denotes a bus master comprising a refresh counter. Numeral 3 denotes a data bus buffer. Numeral 4 denotes an address latch circuit. Numeral 5 denotes a bus changeover circuit for selecting either an address signal fed from the MPU 1 or a refresh address 15 fed from the refresh counter 2. Numeral 6 denotes a readable and writable dynamic memory unit (hereafter referred to as RAM) which must be refreshed at a regular interval. Numeral 7 denotes a read only memory unit (hereafter referred to as ROM) for storing the program or the like. Numeral 10 denotes a clock generating circuit for generating the clock signal to be fed to the MPU 1.

Figure 2:
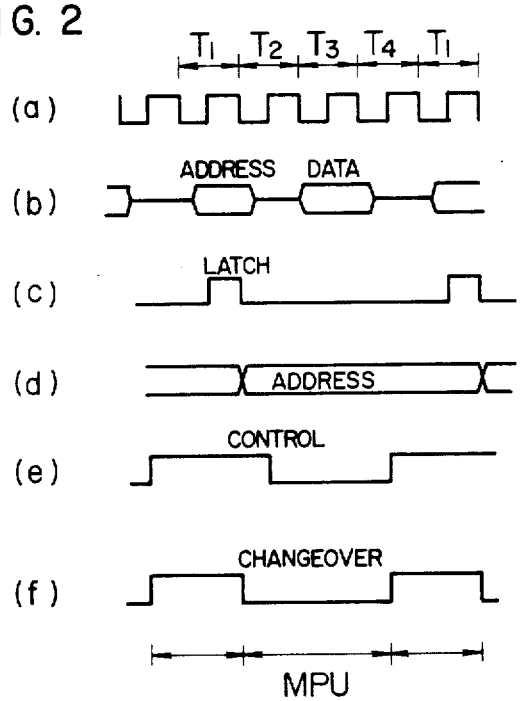
FIG. 2 shows a block diagram of an embodiment of the data processing apparatus according to the present invention.

The MPU 1 operates on the basis of the clock signal (FIG. 2(a)) fed from the clock generating circuit 10. During period T1, the MPU 1 sends out an address signal (FIG. 2(b)) onto a system bus 11 and sends out an address latch signal (FIG. 2(c)) to latch the address signal. The address latch circuit 4 latches the address signal at a falling edge of the address latch signal and continues to send out the address signal thus latched until the falling edge of the next address latch signal.

During period T2, the MPU 1 sends out a read control signal or a write control signal (FIG. 2(e)) in order to direct RAM 6 or ROM 7 to read or write data. Upon receiving the address signal and the read control signal, the RAM 6 sends out data onto a data bus 12. During the latter half of period T3, the MPU 1 takes the data into itself. The period T4 is allocated to preparatory work which is required to complete the instruction and to process the next instruction.

In this way, the minimum number of MPU cycles required to execute one instruction is four. In case a low speed memory wherefrom the data can be read out only at a low speed is used as the RAM 6, however, the period T3 is prolonged to several MPU cycles or several MPU cycles are inserted between the periods T2 and T3. Further, in case it takes a long time for the MPU to perform its internal processing, the period T4 is prolonged to several MPU cycles or several MPU cycles are inserted between the periods T4 and T1.

The RAM 6, ROM 7 or the like needs to be connected to the MPU 1 only during the data generation periods and may be disconnected from the MPU 1 during periods T4 and T1 without hindrance. Therefore, if a detection circuit 22 produces a bus changeover signal (FIG. 2(f)) which is reset at the falling edge of the address latch signal and set at the rising edge of the read control signal or the write control signal and the RAM 6 is switched to either the address latch circuit 4 or the refresh counter 2, which is another bus master, depending upon the bus changeover signal, it becomes possible to refresh the RAM 6 without stopping the operation of the MPU 1. That is to say, during a period from the falling edge of the address latch signal until the rising edge of the read control signal or the write control signal, the bus changeover circuit 5 is switched to the position as illustrated in FIG. 1 to connect the MPU 1 to the RAM 6 and ROM 7 through bus 14 for transferring the data. During any period excepting the above described period, the bus changeover circuit 5 is switched to a position which is opposite to that illustrated in FIG. 1 to transmit the refresh address 15 fed from the refresh counter 2 to the RAM 6 through the bus 14 for refreshing.

Owing to such time shared use of the system bus by the MPU 1 and the refresh counter 2, it becomes possible to obviate lowering of the processing speed in the MPU 1 while refreshing the RAM 6.

The case where the refresh counter is used as a bus master which is different from the MPU 1 has heretofore been described. However, it is also possible to use a second MPU or a direct memory access controller as the different bus master.

For example, as shown in FIG. 3, a second MPU 31 substitutes for the refresh counter 2 and is connected with an address bus 32 which substitutes for the bus 15 and with another data bus 33. Another bus changeover circuit 34 interlocked with the changeover switch 5 is provided in the bus line 12 for changing over the output of the data bus buffer 3 and the data on the bus 33 supplied from the second MPU 31. In FIG. 3, other parts than described above are similar to those in FIG. 1.

In case a second MPU is used instead of the refresh counter 2, a multi-MPU system can be formed by providing a bus changeover circuit on the data bus in the same way as the address bus and switching the data bus together with the address bus.

Further, in the foregoing description, the bus changeover signal has been produced using the address latch signal and the read/write control signal. However, an equivalent bus changeover signal may be produced by using either of the address latch signal and the read/write control signal. For instance, this can be attained by detecting the address latch signal and producing therefrom the bus changeover signal so that the bus will be thereafter switched to the MPU 1 for two cycles of the clock signal.

As heretofore described, it is possible in accordance with the present invention to realize a data processing apparatus wherein the RAM may be refreshed without degrading the data processing speed in the MPU by means of time shared use of the system bus by the MPU 1 and another circuit. In addition, a data processing apparatus of multi-MPU system may easily be realized by using another MPU.

What is claimed is:

1. A data processing apparatus for controlling accessing of a memory comprising:
    memory means having a number of address locations;
    an address bus and a data bus;
    microprocessing means, operating in time with successively received clock signals and connected to said memory means via said data bus, for generating an address signal during a first period of at least one clock signal to specify one of said address locations in said memory means and for performing data transfer on said data bus between said microprocessing means and the address location in said memory means specified by said address signal during a second period of at least one clock signal following said first period;
    detection means for detecting said second period during which said data transfer is to be effected on said data bus between said microprocessing means and the specified address location in said memory means;
    bus master means separate from said microprocessing means for generating an address signal to specify an address location in said memory means for accessing said memory means; and
    bus control means connected to said microprocessing means, said bus master means and said address bus and responsive to the output of said detection means for supplying said address signal from said microprocessing means to said memory means only during said second period of data transfer between said microprocessing means and said memory means, and for supplying said address signal from said bus master means to said memory means to specify a different address location of said memory means whenever no data transfer is being effected between said microprocessing means and said memory means and at least during said first period.

2. A data processing apparatus comprising:
    memory means having a number of address locations;
    an address bus and a data bus;
    microprocessing means connected to memory means via said data bus for generating an address signal to specify one of said address locations in said memory means and for performing data transfer on said data bus between said microprocessing means and the address location in said memory means specified by said address signal;
    detection means for detecting the period during which said data transfer is to be effected on said data bus between said microprocessing means and the specified address location in said memory means; bus master means separate from said microprocessing means for generating an address signal to specify an address location in said memory means for accessing said memory means; and
    address bus control means connected to said microprocessing means and said address bus and responsive to the output of said detection means for supplying said address signal from said microprocessing means to said memory means only during said period of data transfer between said microprocessing means and said memory means, and for supplying said address signal from said bus master means to said memory means to specify a different address location of said memory means whenever no data transfer is being effected between said microprocessing means and said memory means, further comprising latching means for latching said address signal from said microprocessing means, said detection means including means for detecting the data transfer period from completion of latching of said address signal by said latching means until completion of a read/write control signal produced by said microprocessing means and said address bus control means including means for connecting said memory means to said latching means only during said data transfer period.

3. A data processing apparatus according to claim 1, wherein said memory means comprises a dynamic memory which must be refreshed and said bus master means comprises a refresh counter which produces an address signal for refreshing said dynamic memory.

4. A data processing apparatus according to claim 1, wherein said bus master means comprises another microprocessing means which is independent from said microprocessing means.

5. A data processing apparatus according to claim 2, wherein said memory means comprises a dynamic memory which must be refreshed and said bus master means comprises a refresh counter which produces an address signal for refreshing said dynamic memory.

6. A data processing apparatus according to claim 2, wherein said bus master means comprises another microprocessing means which is independent from said microprocessing means.

7. A data processing apparatus, comprising:
memory means having a number of address locations;
an address bus and a data bus;
microprocessing means connected to memory means via said data bus for generating an address signal to specify one of said address locations in said memory means and for performing data transfer on said data bus between said microprocessing means and the address location in said memory means specified by said address signal;
detection means for detecting the period during which said data transfer is to be effected on said data bus between said microprocessing means and the specified address location in said memory means; bus master means separate from said microprocessing means for generating an address signal to specify an address location in said memory means for accessing said memory means; and
address bus control means connected to said microprocessing means and said address bus and responsive to the output of said detection means for supplying said address signal from said microprocessing means to said memory means only during said period of data transfer between said microprocessing means and said memory means, and for supplying said address signal from said bus master means to said memory means to specify a different address location of said memory means whenever no data transfer is being effected between said microprocessing means and said memory means, wherein said microprocessing means includes means for producing a latching control signal during generation of said address signal by said microprocessing means and a read/write control signal for controlling reading and writing of data from and to said memory means, and further comprising a latch circuit connected to said microprocessing means for latching said address signal from said microprocessing means in response to said latching control signal.

8. A data processing apparatus according to claim 7, wherein said detection means includes means for detecting the data transfer period as a time which extends from the trailing edge of said latching control signal to the trailing edge of said read/write control signal.

9. A data processing apparatus according to claim 8, wherein said address bus control means comprises switching means connected to said latch circuit, said bus master means and said address bus, and which operates in response to the output of said detection means, for connecting said latch circuit to said address bus during said data transfer period and for connecting said bus master means to said address bus at all other times.

10. A data processing apparatus according to claim 9, wherein said memory means comprises a dynamic memory which must be refreshed and said bus master means comprises a refresh counter which produces an address signal for refreshing said dynamic memory.

11. A data processing apparatus according to claim 9, wherein said bus master means comprises another microprocessing means which is independent from said microprocessing means.

* * * * *